(12) United States Patent
Borenstein

(10) Patent No.: US 6,673,694 B2
(45) Date of Patent: Jan. 6, 2004

(54) METHOD FOR MICROFABRICATING STRUCTURES USING SILICON-ON-INSULATOR MATERIAL

(75) Inventor: Jeffrey T. Borenstein, Holliston, MA (US)

(73) Assignee: The Charles Stark Draper Laboratory, Inc., Cambridge, MA (US)

(*) Notice: Subject to any disclaimer, the term of this patent is extended or adjusted under 35 U.S.C. 154(b) by 0 days.

(21) Appl. No.: 10/038,890

(22) Filed: Jan. 2, 2002

(65) Prior Publication Data
US 2002/0190319 A1 Dec. 19, 2002

Related U.S. Application Data

(60) Provisional application No. 60/259,282, filed on Jan. 2, 2001.

(51) Int. Cl.$^7$ .............................................. H01L 21/76
(52) U.S. Cl. ...................... 438/411; 438/50; 438/53; 438/696; 438/700; 438/701; 438/456; 257/414; 257/415; 257/416; 257/417
(58) Field of Search ................... 438/50, 53, 347, 438/411, 696, 700–701, 707, 48, 706, 164, 456, 459; 359/879; 216/79; 257/414–417; 361/280

(56) References Cited

U.S. PATENT DOCUMENTS

| | | | | |
|---|---|---|---|---|
| 3,922,705 A | * | 11/1975 | Yerman ........................ 357/26 |
| 4,079,508 A | * | 3/1978 | Nunn .......................... 29/580 |
| 5,488,012 A | * | 1/1996 | McCarthy | |
| 5,760,443 A | * | 6/1998 | McCarthy ................... 257/347 |
| 6,077,721 A | | 6/2000 | Fukada et al. ................ 438/53 |
| 6,105,427 A | * | 8/2000 | Stewart et al. ........... 73/514.32 |
| 6,171,881 B1 | * | 1/2001 | Fujii ........................... 438/52 |
| 6,252,294 B1 | * | 6/2001 | Hattori ........................ 257/620 |
| 6,277,666 B1 | | 8/2001 | Hays et al. ................... 438/50 |
| 6,423,563 B2 | * | 7/2002 | Fukads ......................... 438/50 |
| 6,431,714 B1 | * | 8/2002 | Sawada et al. ............. 359/879 |
| 6,458,615 B1 | * | 10/2002 | Fedder et al. ................. 438/50 |

OTHER PUBLICATIONS

Moore DF, "Silicon–on insulator material for sensors and accelerometers" *Silicon Fabricated Inertial instruments*, 9/1–9/5 (Dec. 1996).

Syms RRA et al., "Surface tension powered self–assembly of 3D MOEMS devices using DRIE of bonded silicon–on–insulator wafers." *IEEE Seminar on Demonstrated Micromachining Technologies for Industry*, 1/1–1/6 (Mar. 2000).

Yamamoto T et al. "Capacitive accelerometer with high aspect ratio single crystalline silicon microstructure using SOI structure with polysilicon–based interconnect technique." *Micro Electro Mechanical Systems*, 515–519 (Jan. 2000).

* cited by examiner

Primary Examiner—Matthew Smith
Assistant Examiner—V. Yevsikov
(74) Attorney, Agent, or Firm—McDermott, Will & Emery

(57) ABSTRACT

The invention provides a general fabrication method for producing MicroElectroMechanical Systems (MEMS) and related devices using Silicon-On-Insulator (SOI). One first obtains an SOI wafer that has (i) a handle layer, (ii) a a dielectric layer, and (iii) a device layer. A mesa etch has been made on the device layer of the SOI wafer and a structural etch has been made on the dielectric layer of the SOI wafer. One then obtains a substrate (such as glass or silicon), where a pattern has been etched onto the substrate. The SOI wafer and the substrate are bonded together. Then the handle layer of the SOI wafer is removed, followed by the dielectric layer of the SOI wafer.

17 Claims, 7 Drawing Sheets

(a) Starting SOI wafer (b) Mesa Etch (c) Structural Etch

PROCESS STEPS PRIOR TO SUBSTRATE BONDING

1. Start Substrate Wafer

2. Deposit Masking Material

3. Pattern Masking Material

4. Etch Substrate Wafer

PRIOR ART MICROFABRICATION PROCESS

PROCESS STEPS PRIOR TO SUBSTRATE BONDING (a) Starting glass substrate (b) Recess etch glass (c) Sputter and liftoff metal (d) Drill access port in glass

PROCESS STEPS FOR GLASS SUBSTRATE

BONDING, WAFER THINNING AND OXIDE DIELECTRIC REMOVAL

BASELINE BESOI PROCESS SEQUENCE.

(a) EPITAXIAL COMB FINGERS.
(a) BASELINE BESOI COMB FINGERS

PHENOMENON OF RIE LAG, WHERE NARROW TRENCHES ETCH MORE SLOWLY

METHOD FOR MICROFABRICATING STRUCTURES USING SILICON-ON-INSULATOR MATERIAL

CLAIM OF PRIORITY

This application claims priority to U.S. provisional patent application Serial No. 60/259,282, filed Jan. 2, 2001.

FIELD OF THE INVENTION

The invention relates generally to MicroElectroMechanical Systems (MEMS). Specifically, this invention provides a technique for microfabricating structures using Silicon-On-Insulator (SOI) material.

BACKGROUND OF THE INVENTION

The rapidly emerging field of MicroElectroMechanical Systems (MEMS) has penetrated a wide array of applications, in areas as diverse as automotives, inertial guidance and navigation, microoptics, chemical and biological sensing, and biomedical engineering. Use of Silicon-On-Insulator (SOI) material is rapidly expanding in both microelectronic and MEMS applications, because of increasing demand for tight limits on wafer specifications, the low cost of SOI, its process flexibility, radiation hardness and compatibility with high-level integration. Significant benefits may be realized by utilizing SOI material to fabricate inertial sensors, chemical and biological sensors, optoelectronic devices, and a wide range of mechanical structures such as microfluidic and microoptical components and systems. In spite of its many advantages, however, use of SOI wafers to build MEMS devices is not widespread, largely because of difficulties in processing the material.

Prior methods for fabricating MEMS devices using a bonded handle wafer include the dissolved wafer process, in which silicon is bonded to glass and the silicon is dissolved away to reveal an etch-stop layer. This etch-stop layer typically comprises a heavily-doped boron-diffused or boron-doped epitaxial layer, but may also consist of a SiGe alloy layer. However, methods that involve the use of a heavily-boron-doped etch stop suffer in several respects, including poor process control, high defect densities, limitations on ultimate thickness of devices, and incompatibility with microelectronic device integration. Insertion of a SiGe alloy layer resolves several of these limitations, but that method suffers from relatively low deposition rates and material property issues. SOI micromachining has demonstrated that a limited number of device types may be successfully constructed, but the build quality is lacking and many design constraints exist.

The principal constraint involves the problems encountered when performing deep reactive-ion-etching (RIE) of the silicon device layer on top of the oxide interlayer; the RIE process tends to attack the underside of the silicon device layer due to RIE lag, non-uniformity and other effects. Steps have been taken by RIE equipment vendors to resolve this problem, and such methods have mitigated these etch effects. However, these solutions require that the RIE process be conducted when the silicon device layer is in intimate contact with the oxide interlayer everywhere, otherwise underside attack of the silicon device layer still occurs.

This requirement has led to the development of alternative SOI processes. However, these alternative processes encounter stringent design rules related to pressure differentials across the thin oxide interlayer. Survival of the oxide interlayer is important for the success of alternative SOI processes, but no solution to this problem has previously been proposed.

Thus, there is a need in the art for a method that relieves the constraints for SOI processing.

SUMMARY OF THE INVENTION

The invention provides a general fabrication method for producing MicroElectroMechanical Systems (MEMS) and related devices using Silicon-On-Insulator (SOI) material. One first obtains a Silicon-On-Insulator (SOI) wafer, which has (i) a handle layer, (ii) a a dielectric layer, and (iii) a device layer. A mesa etch has been made on the device layer of the SOI wafer and a structural etch has been made on the dielectric layer of the SOI wafer. One then obtains a substrate (such as glass or silicon), where a pattern has been etched onto the substrate. The SOI wafer and the substrate are bonded together. Then the handle layer of the SOI wafer is removed, followed by the dielectric layer of the SOI wafer.

The method of the invention provides (1) the ability to micromachine devices on SOI substrates without design constraints for structure spacing, etch gaps, oxide thickness or other features, and (2) a flexibility for handle wafer type and bonding process. This invention also addresses several of the previous barriers to general use of SOI material for MEMS and associated applications. First, the invention enables the use of SOI wafers to build a wide array of device types that were previously only feasible using standard boron etch stop technology. Second, the method allows for the use of RIE etch technology to produce high-quality structures on devices bonded everywhere to a silicon dioxide buried layer. Third, the invention relieves all of the design constraints previously required for SOI structures, including the spacing between structural elements, spacing between the device and the edge of the die, and special requirements for atmospheric conditions during bonding of SOI wafers to handle wafers.

The invention also provides intermediate structures in the general fabrication method. The intermediate structures are mechanically stable, though they contain internal cavities formed by the etched SOI wafer and the substrate. The cavities can be of various shapes and sizes.

In one embodiment, the intermediate structure have an access port in the substrate. The access port provides mechanical stability for the structure. Accordingly, the intermediate structures can be made using components with arbitrary thickness and arbitrary doping.

The invention further provides a method for making an accelerometer, using the methods of the invention.

DETAILED DESCRIPTION OF THE INVENTION

First embodiment. An embodiment of the invention is now described. We begin with a standard SOI wafer, which comprises a handle layer, dielectric layer usually consisting of silicon dioxide, and a device layer (see, FIG. 2a). Such wafers are commercially available from many sources, and are fabricated using wafer bonding, SIMOX technology, Smart-Cut methods, or other processes. Wafers can also be obtained from a large number of vendors of standard semiconductor material, and are sawn and polished to provide precise dimensions, uniform crystallographic orientation, and highly polished, optically flat surfaces.

Parameters for the three layers of the SOI wafer are determined by the user. Typically, the handle wafer is of sufficient thickness for handling purposes, without other requirements. The dielectric layer is thick enough for electrical isolation and effective etch-stop action, yet thin enough so as not to cause severe bowing of the SOI wafer. The device layer parameters are important, as they will translate directly into properties of the resulting structure. Thickness of the device layer determines the device thickness (including any gap that may be machined between the device and the substrate). Electrical resistivity, carbon and oxygen content, growth technique, crystallographic orientation and other wafer parameters are selected based on the properties requited of the end product. Surface finish should be highly polished The interface between the dielectric and device layers should not have voids.

Figure 1:
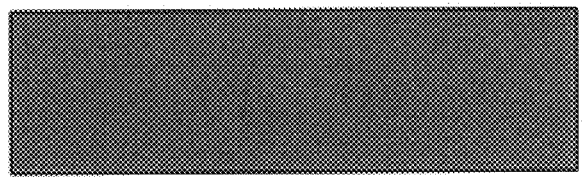
FIG. 1 is a schematic side drawing showing a prior art single depth microfabrication process.
Figure 1:
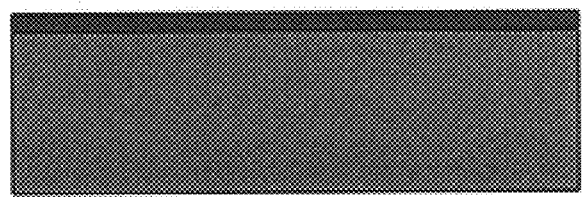
Figure 1:
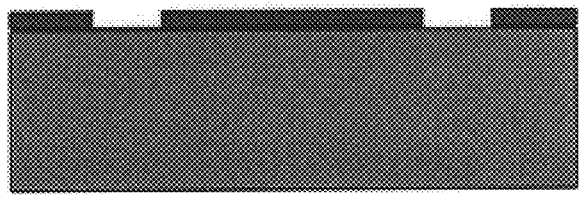
Figure 1:
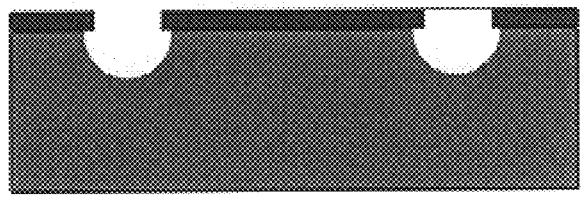
Figure 2:
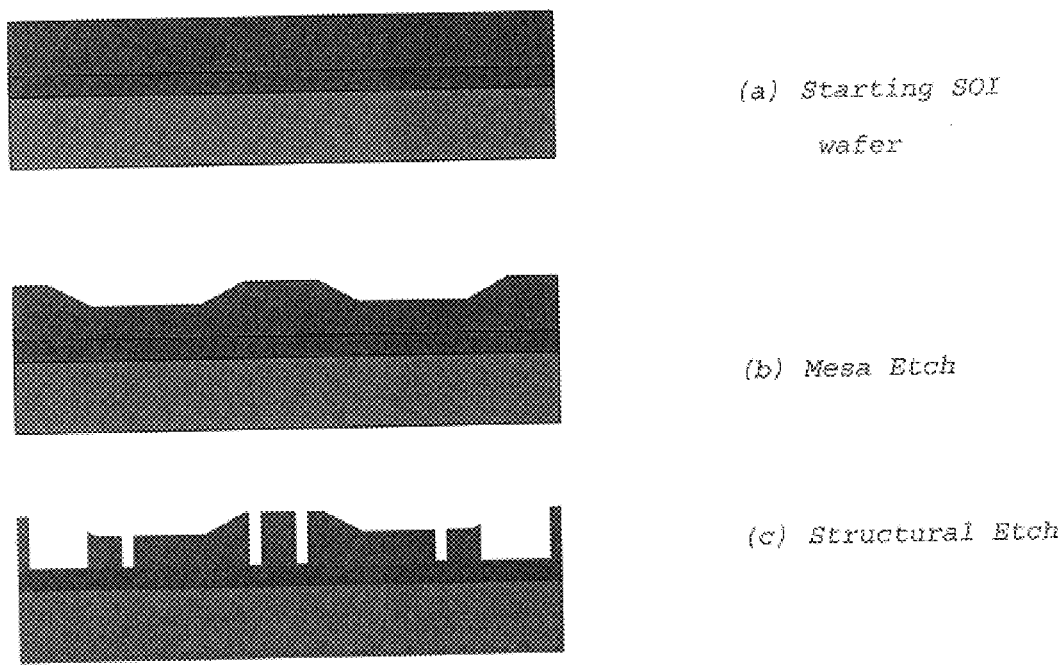
FIG. 2 is a schematic side drawing showing the process steps prior to substrate bonding.

Once the SOI wafer parameters have been selected and the material obtained, processing of the wafer begins. FIG. 2 shows the primary steps involved in preparing the SOI wafer for bonding to a substrate wafer. First the SOI wafer is cleaned and patterned for the "mesa" etch. Here mesas are preserved in the device layer and the background is etched back, so that the final structure, when bonded to a substrate, has regions which are directly bonded (the mesas) and regions suspended above the planar surface of the substrate (i.e., everywhere else on the wafer; see, FIG. 2b).

The mesa etch may be performed using KOH or other crystallographic etchants, which produce angled sidewalls. Crystallographic etches are generally not used on highly-boron-doped layers, since the high doping suppresses etch rates severely. This represents yet another advantage of the SOI process of the invention.

Once the mesa etch has been performed, the wafer is cleaned and patterned for the "structural" etch (see, FIG. 2c). Typically, the structural etch is a Deep Reactive Ion Etch (DRIE) process, in which high aspect ratios may be desired (Ayon A A et al., *Mat. Res. Soc. Symp. Proc.* 546: 51 (1999); Ayon A A et al., *J. Vac. Sci. Tech.* B 18: 1412 (2000)). Since the process etches straight down to the dielectric layer, which is bonded everywhere to the device layer, techniques designed to prevent plasma etching problems at the dielectric-device interface become very effective.

The micromachining in silicon can be observed by the use of epifluorescence microscopy or by the use of metallurgic microscope. Alternatively, the micromachining can be observed by an electron microscope, such as an environmental scanning electron microscope (ESEM).

The SOI wafer that has been patterned and etched for both the mesa and structural layers is then bonded to a substrate. The substrate can be glass, silicon or other equivalently workable material.

Figure 3:
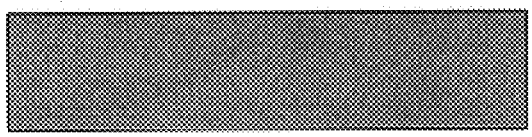
FIG. 3 is a schematic side drawing showing the process steps of the invention for glass substrate fabrication.
Figure 3:
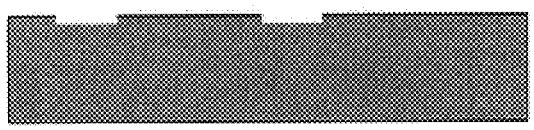
Figure 3:
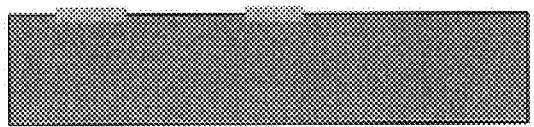
Figure 3:
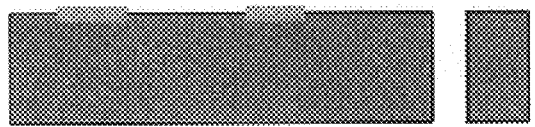

In one embodiment, the fabrication steps for a glass substrate are those outlined in FIG. 3. First, the glass wafer is cleaned and patterned for the electrode pattern. Here, the electrode pattern is composed of multilevel metallization. The glass wafer is then recess-etched, and, without removing the photoresist, a blanket sputter of the multilevel metallization is performed. Finally, the wafer undergoes "lift-off", where metal not applied directly to the substrate is removed.

Note that in FIG. 3d, a additional step has been added; the formation of access ports in the glass. The advantage for this process step is described below, where the substrate wafer is bonded to the processed SOI wafer. These access ports may be etched, or more preferably, mechanically or ultrasonically drilled through the glass. The spacing of these holes is determined by the die size and by the presence and distribution of bonded seals between the SOI wafer and the substrate. Since the purpose of the access ports is to equalize the pressure between the internal cavities and outside of the wafer sandwich, at least one such port must be positioned within each region sealed by bonding. Typically, these regions coincide with the die size, so that each device is isolated from all others by a bonded structure known as a seal ring.

Figure 4:
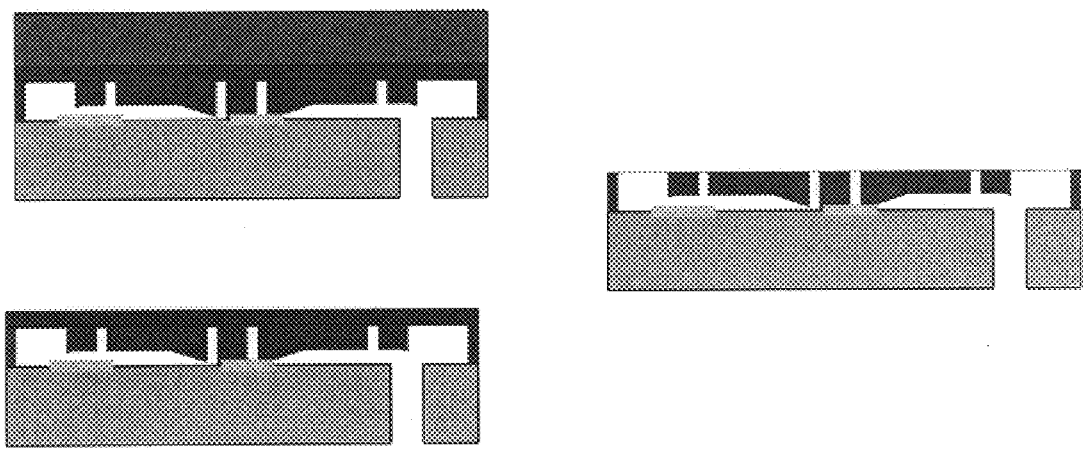
FIG. 4 is a schematic side drawing showing bonding, wafer thinning and oxide dielectric removal.

Once the SOI and glass wafers have been processed, they are bonded together. This is usually accomplished by anodic bonding. The remainder of the process sequence is illustrated in FIG. 4. Note that the presence of the access port ensures that the inner cavities are at the same pressure as the external environment.

Without the access port, the quantity of gas inside the cavity is fixed when the bond is formed. Applying the ideal gas law, the pressure inside the cavity $p=nRT/NV$, where n is the number of moles of gas present (fixed), V is the volume of the cavity (fixed), R is the universal gas constant, and T is the temperature. If the bonding is performed at 300° C. and 1 atmosphere, for instance, the pressure inside the cavity at room temperature is $(293/573)$ atm~0.5 atm. Therefore, in room ambient, the cavity is in an underpressure situation, while in a vacuum chamber, it is at an overpressure situation. For any specific pressure condition during bonding, once the wafer sandwich has cooled, the pressure inside the cavity will be different from that of the outside world. Analysis indicates that such a pressure differential will lead to fracture of the oxide interlayer and subsequent structural layer failure in all but the moat tightly controlled circumstances. Use of an access port resolves the problem of the pressure differential.

Once the wafers have been bonded together, with the device side of the SOI wafer bonded to the metallized side of the glass, the handle layer of the SOI wafer must be removed. Without an access port, this material may be removed in a wet chemical etch or by a dry plasma etch. With the access port present, only the dry process is used. For example, a pancake RIE reactor may be used to remove the handle silicon layer. One required feature of RIE process tool is that it enables the plasma removal to occur with equalized pressure across the oxide dielectric. The other required feature is that plasma gases cannot gain access to the cavity through the port; otherwise, attack of structural layers would ensue.

The final step in the process is removal of the oxide dielectric. In this as well as previous embodiments, removal of the dielectric layer must be performed using a dry plasma etch process, so as not to attack the bulk glass and metallization on the topside of the device. Once the dielectric has been removed, the final structure is produced.

This structure is expected to have excellent build quality, as it benefits from several significant process improvements: (1) high material quality through use of virgin SOI material rather than highly doped layers; (2) crystallographic mesa etch rather than plasma etch, resulting in greatly improved subsequent patterning; (3) very high fidelity DRIE processing, due to fully bonded device and oxide dielectric layer during the etch process, and newly-developed vendor equipment and processes designed specifically for these applications; (4) high quality access port holes, drilled using ultrasonic methods which produce smooth walls without stress concentrations; (5) complete flexibility in wafer bonding process, without concern for ambient conditions and resulting pressure differentials; and (6) dry plasma etch wafer thinning process, which allows for pressure equalization across oxide dielectric, eliminating possible exposure of device layer to etchant.

One group of former methods for fabricating micromachined structures in silicon involves the use of an etch-stop such as heavily-doped boron layers or SiGe layers. The method of the invention has several distinct advantages over that family of techniques, including increased process flexibility without the requirement for heavy doping, a higher-quality silicon device layer, and improved process control.

The invention is also an improvement over prior art methods for micromechanical structure fabrication with SOI material. Some of the prior art involved processes in which the critical deep reactive-ion-etch (DRIE) step occurred after bonding of the SOI wafer to a handle wafer. In those embodiments, the DRIE process often causes severe damage to resulting structures. Plasma etch vendors have developed techniques to mitigate damage to structures during the RIE process, but such techniques are not designed for SOI processing when the critical DRIE step is performed after bonding to a substrate wafer. Other embodiments perform DRIE before handle wafer bonding. In this manner, techniques developed to eliminate plasma etching damage become very effective. However, those methods impose several process requirements and suffer large yield losses due to bonding constraints, pressure differentials across the oxide layer, and other effects. This method relieves all of these design and process constraints.

Alternative embodiments. Alternate methods for the invention include, but are not limited to (1) the use of silicon or other crystalline substrates rather than a glass substrate, (2) anodic bonding using a thin layer of sputtered Pyrex® rather than a full glass wafer, (3) fusion bonding rather than anodic bonding of the lower handle wafer, etching or other processes rather than ultrasonic drilling, (4) alternate means for removing the SOI handle layer, and (5) the use of materials other than silicon and silicon dioxide for the device layer and etch-stop layer, respectively. Wafers made from Pyrex®, other borosilicate glass, or other glasses can also be procured and inserted into micromachining processes, with alternative processes used to etch the glassy materials. See, published PCT patent application WO 00/66036; Kaihara et al., *Tissue Eng* 6(2): 105–17 (April 2000).

Plasma etching provides the ability to control the width of etched features as the depth of the channel is increased. Wet chemical processes typically widen the trench substantially as the depth is increased, leading to a severe limitation on the packing density of features (Fruebauf J & Hannemann B, *Sensors and Actuators* 79: 55 (2000)). Several different plasma etching technologies have been recently developed. One of the newest and most powerful tools is known as High Aspect Ratio Micromachining (HARMS; Ayon A A et al., *J. Vac. Sci. Tech.* 18: 1412 (2000); Hynes A M et al., *Sensors and Actuators* 74: 13 (1999)) A major advance realized by HARMS technology is the ability to etch channels of virtually unlimited depth without increasing the width of lithographically defined features. Channels etched using HARMS technology maintained their width to +/−1 micron for trenches as deep as 40 microns. This process control is obtained by maintaining sidewall angles of 90+/−1°.

Uses of the Invention. Commercial applications for this technology include, but are not limited to, inertial sensors for the automotive and other transport businesses, chemical and biological sensors for the biomedical and environmental monitoring businesses, industrial control sensors, actuators and components for the optoelectronics industry, and components for use in microfluidic applications aimed at biomedical and other technologies.

The invention is also useful in the manufacture of an accelerometer. An acceleometer pattern is etched into the SOI wafer. Guidance for making an accelerometer is provided in U.S. Pat. No. 6,269,696, "Temperature compensated oscillating accelerometer with force multiplier", issued Aug. 7, 2001 to Weinverg et al., incorporated herein by reference.

The details of one or more embodiments of the invention are set forth in the accompanying description above. Although any methods and materials similar or equivalent to those described herein can be used in the practice or testing of the present invention, the preferred methods and materials are now described. Other features, objects, and advantages of the invention will be apparent from the description and from the claims. In the specification and the appended claims, the singular forms include plural referents unless the context clearly dictates otherwise. Unless defined otherwise, all technical and scientific terms used herein have the same meaning as commonly understood by one of ordinary skill in the art to which this invention belongs. All patents and publications cited in this specification are incorporated by reference.

The following EXAMPLES are presented in order to more fully illustrate the preferred embodiments of the invention. These examples should in no way be construed as limiting the scope of the invention, as defined by the appended claims.

EXAMPLE

Fabrication Method for ALT BESOI SOA3

Summary. Several significant barriers to successful fabrication of the Silicon Oscillator Accelerometer using Silicon-On-Insulator (SOI) material have been encountered, necessitating the use of epitaxial material to build acceptable devices. Use of SOI rather than epitaxial material is strongly preferred for numerous reasons, including process flexibility, radiation hardness, performance, and IP issues. Here we show a method for producing SOA3 devices from SOI material. This process, coined the "ALT BESOI" process, appears to overcome current barriers to SOI processing.

Principal Advantages of SOI vs. Epitaxial Process. The driving force for using SOI material instead of epitaxial material to build the SOA3 is the greatly enhanced process flexibility afforded by the SOI process. For high performance, the best crystallographic quality is expected to produce the best devices. Device layers on SOI wafers can be of any doping level, type, crystallographic quality, etc. By contrast, epitaxial layers must be heavily-doped with boron, and in order to reduce lattice distortion and defect densities, germanium is added for strain compensation. High doping concentrations of B are associated with etch pits, extended defects, curvature and strain, all undesirable features for strategic devices. Addition of Ge improves crystalline quality substantially, but appears to lower the Q factor, and may have other undesirable effects.

In addition to raw performance considerations, boost requirements require that the SOA3 be radiation hardened against fast neutrons, thermal neutrons and gamma radiation. Boron doping reduces hardness against thermal neutrons; therefore SOI material is preferred. More importantly, the glass substrate, whether pyrex or Hoya SD-2, exhibits compaction under fast neutron and gamma irradiation [C. Allred, *Master's Thesis, MIT Materials Science and Engineering Department,* August 2000 Fabrication of an SOA3 built from SiGeB epitaxial material would be difficult to impossible with a silicon-on-silicon process, but would be very compatible with the use of SOI material for the device layer.

Figure 5:
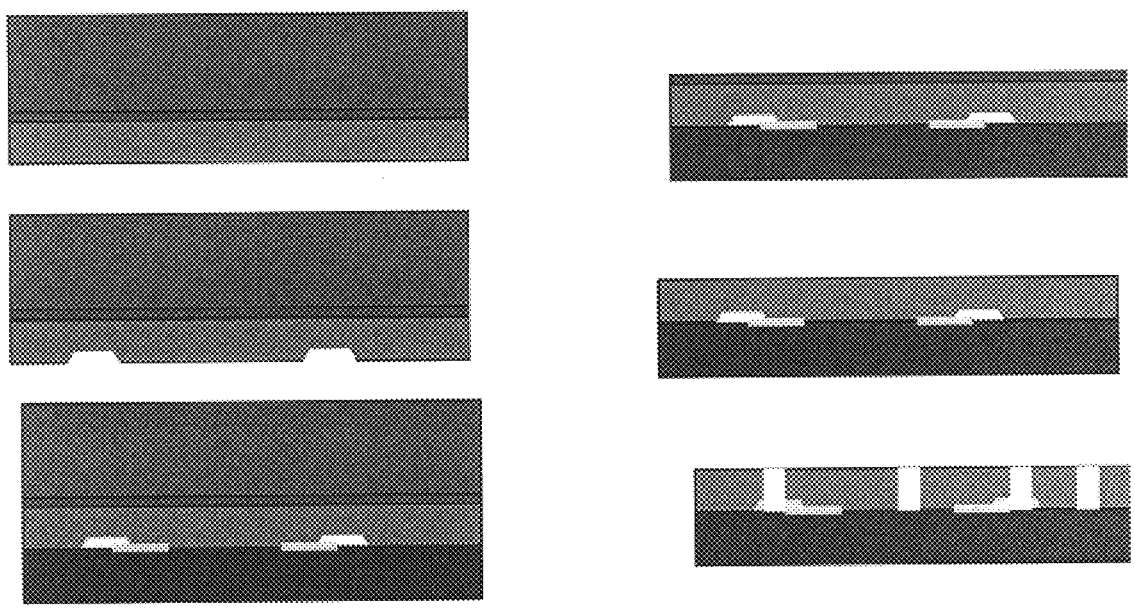
FIG. 5 is a schematic side drawing showing the baseline BESOI process sequence.

Process Difficulties with Baseline BESOI Process. Fabrication yields for the SOA2 were extremely low, partly due to the very large (>1 cm) die size, but also due to process problems with the baseline BESOI sequence. In FIG. 5, the basic process sequence is illustrated. Difficulties with this process are mainly associated with the final step in the process, in which the structural element is etched into the SOI device layer using the ICP process.

Etching of the structural element in epitaxial processes occurs prior to bonding to the glass substrate. Therefore, the ICP etch must penetrate below the line of the SiGeB etch stop layer, so that subsequent backside wafer dissolution results in full release. When the ICP process stops in a silicon wafer, a phenomenon known as RIE lag, shown in FIG. 6, causes wide features to etch deeper than narrow features. However, this over-etch causes no serious harm, since wide features simply penetrates more deeply into the silicon wafer.

Figure 7:
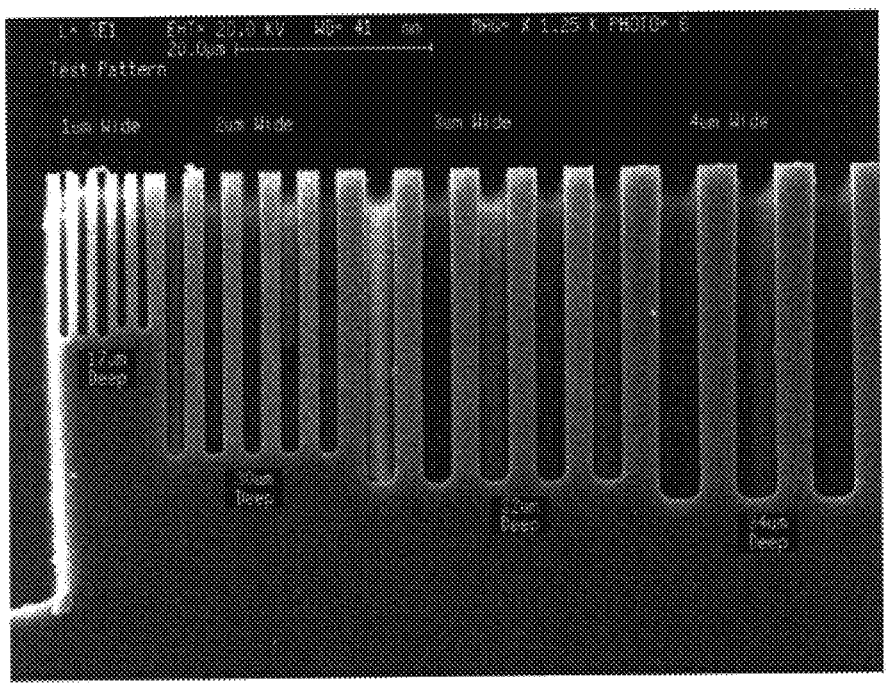
FIG. 7 is an electron micrograph showing the phenomenon of RIE lag, where narrow trenches etch more slowly.

By contrast, when the ICP etch stops on a substrate such as the glass, wide features cannot etch any deeper, and therefore the plasma attacks the underside of released features and forms notches near the silicon—glass interface. This phenomenon in illustrated in FIG. 7, where first SEM image shows what comb fingers should look like (epitaxial process), while the second SEM image shows comb fingers built using the standard BESOI process. Severe attack of the bottom of the comb fingers (comb is turned upside down for better visibility) is evident.

New ICP etch technology is specifically aimed at reducing notching and underside attack. However, the new technology is most effective when silicon is directly bonded to the non-etching substrate, such as glass or oxide. In the baseline BESOI embodiment, a gap exists between the substrate and the proof mass, flexures, anchor beams and other critical features. The presence of this gap greatly reduces the ability of the new ICP SOI etch technology to prevent notching and underside attack. Such limitations with the baseline BESOI process provide impetus to explore alternatives for fabricating SOI devices. Alternatives attempted to date principally address the notching problem, and entail ICP etching down to the buried oxide layer prior to anodic bonding.

Process Difficulties with Initial Attempts at an Alternative SOI Process. High fidelity etching of the structural layer using an SOI wafer requires that the ICP process be conducted when the device layer is fully bonded to the oxide dielectric. The most obvious alternative SOI process therefore entails ICP etching prior to wafer bonding, followed by wafer thinning and oxide removal after the wafer bond.

Attempts to produce SOA3 devices using the sequence as modified above have not been successful. Basically, the oxide etch-stop mechanically fails during wafer thinning, resulting in attack of silicon underneath the etch-stop, and all devices are obliterated.

A re-design was performed, in which towers of silicon underneath the etch stop, but not connected to the device, could be inserted to insure mechanical survival during thinning. However, the most serious mechanical problem was the pressure differential between the internal cavities and the ambient. Since anodic bonding of the glass substrate is performed at 345° C., the pressure in the cavity at room temperature is, from the ideal gas law, $$P=nRT/V, \qquad (1)$$

where n is the number of moles, R the universal gas constant, and V the volume, all fixed. Since anodic bonding is performed at atmospheric pressure, the internal cavity pressure at room temperature is P=(293 K/(273+345)K) ~0.45 atm. Therefore, at room ambient, the cavity will tend to implode, while in a vacuum chamber, the cavity will tend to burst.

Intermediate steps such as anodic bonding in a vacuum could be undertaken to eliminate pressure differentials during wafer thinning, but if the wafers were to break vacuum, the layer would burst. In addition, the quality of anodic bonds is known to be degraded when performed in vacuo. Finally, serious design constraints aimed at reducing stresses at the oxide-device layer interface would be required, limiting process flexibility and potentially harming performance.

Basic Description of New ALT BESOI Process. Herein is presented a new, alternative BESOI process, coined "Alt BESOI." As the initial prototype alternative processes did, this new process differs from baseline BESOI in that ICP etching occurs prior to anodic bonding.

Four salient differences from initial prototype alternative BESOI processes are (1) ICP etch is conducted using newly available SOI etch technology, (2) A pressure relief hole is inserted in the glass to eliminate pressure differentials during wafer thinning, (3) Wafer thinning is accomplished using a dry plasma process rather than a wet etch, and (4) The die layout is adjusted to minimie the spacing between anchored features (without affecting the actual SOA3 design.)

We began with a standard SOI wafer, similar to that used in both the baseline and prototype alternative SOI processes. In FIG. 4, we show the primary steps involved in preparing the SOI wafer for bonding to a substrate wafer. First, the SOI wafer is cleaned and patterned for the mesa etch. The mesa etch may be performed using KOH or other crystallographic etchants, which produce angled sidewalls. Crystallographic etches may not be used on highly-boron-doped layers, since the high doping suppresses etch rates severely. This represents yet another advantage of the SOI process over its predecessors.

Once the mesa etch has been performed, the wafer is cleaned and patterned for the structural etch. Since the process etches straight down to the dielectric layer, which is bonded everywhere to the device layer, technology designed to prevent plasma etching problems at the dielectric—device interface becomes very effective.

In one embodiment, the SOI wafer, which has been patterned and etched through both the mesa and structural layers, is then bonded to a glass substrate. The glass substrate fabrication steps are outlined in FIG. 6. First, the glass wafer is cleaned and patterned for the electrode pattern. In this embodiment, the electrode pattern is composed of multilevel metallization. The glass wafer is then recess-etched, and, without removing the photoresist, a blanket sputter of the multilevel metallization is performed. Finally, the wafer undergoes "lift-off", where metal not applied directly to the substrate is removed.

The advantage of access ports is evident, as the substrate wafer is bonded to the processed SOI wafer. These access ports may be etched, or more preferably, mechanically or ultrasonically drilled through the glass. The spacing of these holes is determined by the die size and by the presence and distribution of bonded seals between the SOI wafer and the substrate. Since the purpose of the access ports is to equalize the pressure between the internal cavities and outside of the wafer sandwich, at least one such port must be positioned within each region sealed by bonding. Typically, these regions coincide with the die size, so that each device is isolated from all others by a bonded structure known as a seal ring.

Figure 6:
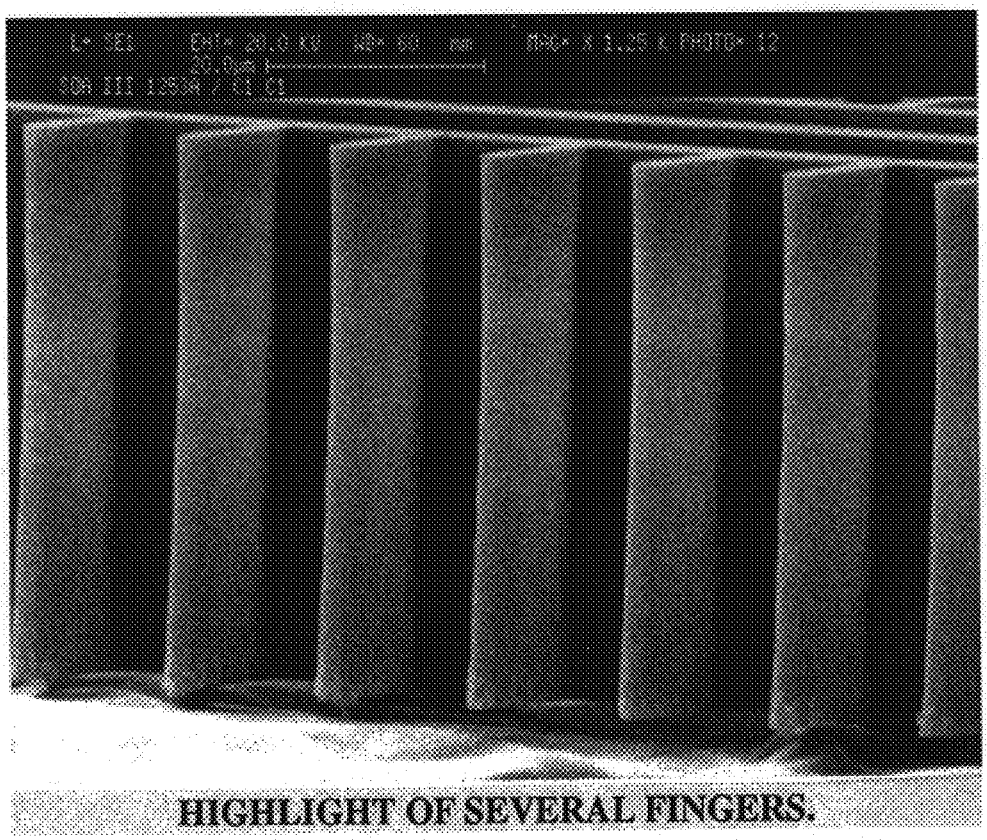
FIG. 6 is a set of electron micrographs showing (a) epitaxial comb fingers and (b) the baseline BESOI comb fingers.
Figure 6:
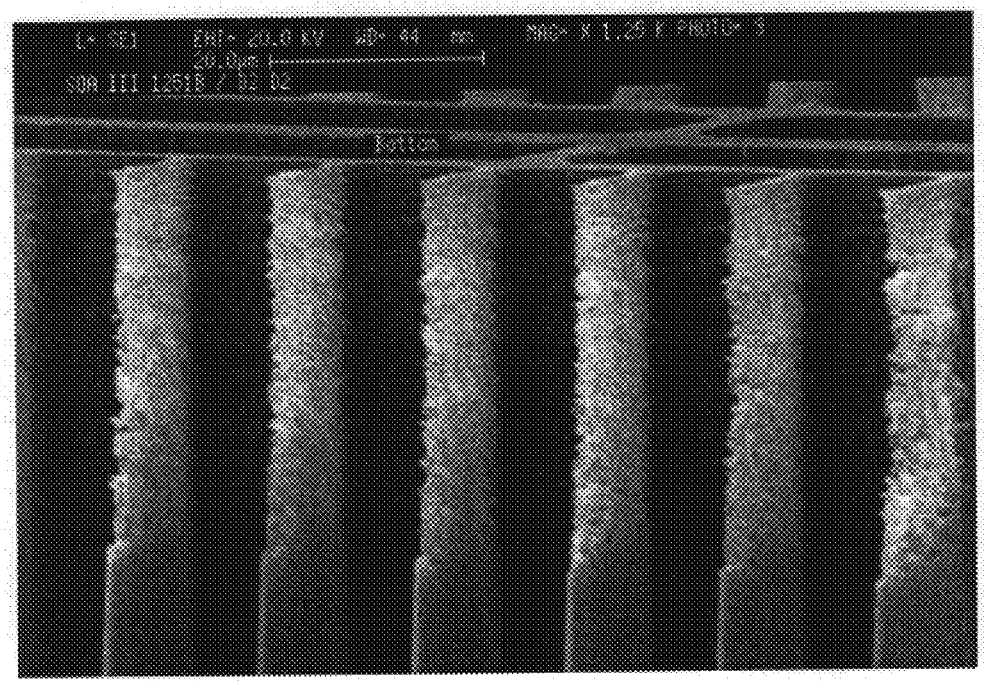

Once the SOI and glass wafers have been processed, they are anodically bonding. The remainder of the process sequence is illustrated in FIG. 6. Note that the presence of the access port ensures that the inner cavities are at the same pressure as the external environment. Without this access port, the quantity of gas inside the cavity is fixed when the bond is formed.

Once the wafers have been bonded together, with the device side of the SOI wafer bonded to the metallized side of the glass, the handle layer of the SOI wafer must be removed. Without an access port, this material may be removed in a wet chemical etch or by a dry plasma etch. With the access port present, only the dry process may be used. For the present example, a pancake RIE reactor may be used to remove the handle silicon layer. One required feature of RIE process tool is that it enables the plasma removal to occur with equalized pressure across the oxide dielectric. The other required feature is that plasma gases cannot gain access to the cavity through the port; otherwise, attack of structural layers would ensue.

The final step in the process is removal of the oxide dielectric. In this as well as previous embodiments, removal of the dielectric layer must be performed using a dry plasma etch process, so as not to attack the bulk glass and metallization on the topside of the device. Once the dielectric has been removed, the final structure is revealed. Excellent build quality is expected, based upon the use of the new ICP SOI etching technology and pressure equalization during thinning.

The foregoing description has been presented only for the purposes of illustration and is not intended to limit the invention to the precise form disclosed, but by the claims appended hereto.

I claim:

1. A method for producing micromachined devices, comprising the steps of:
   (a) obtaining a Silicon-On-Insulator (SOI) wafer, which comprises
      (i) a handle layer,
      (ii) a dielectric layer, and
      (iii) a device layer;
         wherein a mesa etch has been made on the device layer of the SOI wafer, and a structural etch has been made in the device layer of the SOI wafer, such that the etch is straight down through the device layer to the dielectric layer;
   (b) obtaining a substrate, wherein a pattern has been formed onto the substrate;
   (c) bonding the SOI wafer and the substrate together;
   (d) removing the handle layer of the SOI wafer by a wet chemical etch;
   (e) removing the dielectric layer of the SOI wafer by a dry plasma etch.

2. The method of claim 1, wherein the dielectric layer of the SOI wafer comprises silicon dioxide.

3. The method of claim 1, wherein the structural etch layer is a Deep Reactive Ton Etch.

4. The method of claim 1, wherein the substrate is glass or silicon.

5. The method of claim 1, wherein the substrate is glass and the substrate pattern comprises multilevel metallization.

6. The method of claim 1, wherein the substrate is a recess-etched glass wafer.

7. The method of claim 6, further comprising the steps of
   (a) performing a blanket sputter of the multilevel metallization; and
   (b) lifting off the metal not directly applied to the substrate.

8. The method of claim 1, wherein the bonding of the SOI wafer and the substrate is anodic bonding.

9. A method for making an acceleometer, comprising the steps of:
   (a) obtaining a Silicon-On-Insulator (SOI) wafer, which comprises
      (i) a handle layer,
      (ii) a dielectric layer, and
      (iii) a device layer;
         wherein a mesa etch has been made on the device layer of the SOI wafer, a structural etch has been made in the device layer of the SOI wafer, such that the etch is straight down through the device layer to the dielectric layer; and
         wherein the pattern of the etches comprises a pattern for an accelerometer;
   (b) obtaining a substrate, wherein a pattern has been formed onto the substrate;
   (c) bonding the SOI wafer and the substrate together;
   (d) removing the handle layer of the SOI wafer by a wet chemical etch;
   (e) removing the dielectric layer of the SOI wafer by a dry plasma etch.

10. A method for producing micromachined devices, comprising the steps of:
   (a) obtaining a Silicon-On-Insulator (SOI) wafer, which comprises
      (i) a handle layer,
      (ii) a dielectric layer, and
      (iii) a device layer;
         wherein a mesa etch has been made on the device layer of the SOI wafer,
   (b) obtaining a substrate, wherein a pattern has been formed onto the substrate;
   (c) bonding the SOI wafer and the substrate together;
   (d) removing the handle layer of the SOI wafer by a wet chemical etch;
   (e) removing the dielectric layer of the SOI wafer by a dry plasma etch,
   (f) making a structural etch in the device layer of the SOI wafer, such that the etch is straight down through the device layer to the substrate.

11. The method of claim 10, wherein the dielectric layer of the SOI wafer comprises silicon dioxide.

12. The method of claim 10, wherein the structural etch is a Deep Reactive Ion Etch.

13. The method of claim 10, wherein the substrate is glass or silicon.

14. The method of claim 10, wherein the substrate is glass and the substrate pattern comprises multilevel metallization.

15. The method of claim 10, wherein the substrate is a recess-etched glass wafer.

16. The method of claim 15, further comprising the steps of
  (a) performing a blanket sputter of the multilevel metallization; and
  (b) lifting off the metal not directly applied to the substrate.

17. The method of claim 10, wherein the bonding of the SOI wafer and the substrate is anodic bonding.

* * * * *

UNITED STATES PATENT AND TRADEMARK OFFICE
CERTIFICATE OF CORRECTION

PATENT NO.    : 6,673,694 B2
DATED         : January 6, 2004
INVENTOR(S)   : Jeffrey T. Borenstein It is certified that error appears in the above-identified patent and that said Letters Patent is hereby corrected as shown below:

<u>Title page,</u>
Item [75], Inventor, add -- William D. Sawyer, Arlington, MA --

<u>Column 10,</u>
Line 10, after "etch", delete "layer";
Line 11, after "Reactive", delete "Ton", and insert thereof -- Ion --.

Signed and Sealed this

Twentieth Day of April, 2004

JON W. DUDAS
*Acting Director of the United States Patent and Trademark Office*